(12) United States Patent
Besser et al.

(10) Patent No.: US 6,511,911 B1
(45) Date of Patent: Jan. 28, 2003

(54) METAL GATE STACK WITH ETCH STOP LAYER

(75) Inventors: Paul R. Besser, Austin, TX (US); Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 44 days.

(21) Appl. No.: 09/824,218

(22) Filed: Apr. 3, 2001

(51) Int. Cl.[7] ............................................... H01L 21/44
(52) U.S. Cl. ..................... 438/656; 438/737; 438/738; 438/742
(58) Field of Search ................... 438/654, 656, 438/737, 738, 742

(56) References Cited

U.S. PATENT DOCUMENTS

| | | | | |
|---|---|---|---|---|
| 6,001,716 A | * | 12/1999 | Liao | 438/585 |
| 6,087,269 A | * | 7/2000 | Williams | 438/735 |
| 6,255,204 B1 | * | 7/2001 | Tobin et al. | 438/592 |
| 6,261,934 B1 | * | 7/2001 | Kraft et al. | 438/592 |
| 6,376,349 B1 | * | 4/2002 | Tobin et al. | 438/592 |
| 6,383,942 B1 | * | 5/2002 | Narita et al. | 438/720 |
| 2002/0086507 A1 | * | 7/2002 | Park et al. | 438/585 |

OTHER PUBLICATIONS

Hu et al., Feasibility of Using W/TiN as Metal Gate for Conventional 0.13 um CMOS Technology and Beyond, IEDM, 1997, pp. 33.2.1–33.2.4.*
Lu et al., Dual–Metal Gate Technology for Deep–Submicron CMOS Transistors, 2000 Symposium on VLSI Technology Digest of Technical Papers, pp. 72–73.*
G.C. Schwartz et al., "Reactive Ion Etching of Copper Films", J. Electrochem. Soc.: Accelerated Brief Communication, vol. 130, No. 8, pp. 1777–1779, Aug. 1983.
K. Tokunaga et al., "Aluminum Etching in Carbon Tetrachloride Plasmas", Journal of the Electrochemical Society, vol. 127, No., pp. 928–932, Apr. 1980.

* cited by examiner

Primary Examiner—Richard Elms
Assistant Examiner—Christian D. Wilson

(57) ABSTRACT

A metal gate structure and method of forming the same employs an etch stop layer between a first metal layer, made of TiN, for example, and the metal gate formed of tungsten. The etch stop layer prevents overetching of the TiN during the etching of the tungsten in the formation of the metal gate. The prevention of the overetching of the TiN protects the gate oxide from undesirable degradation. The provision of aluminum or tantalum in the etch stop layer allows a thin etch stop layer to be used that provides adequate etch stopping capability and does not undesirably affect the work function of the TiN.

10 Claims, 4 Drawing Sheets

METAL GATE STACK WITH ETCH STOP LAYER

RELATED APPLICATIONS

The present invention contains subject matter similar to that disclosed in U.S. application Ser. No. 09/810,348, filed on Mar. 19, 2001.

FIELD OF THE INVENTION

The present invention relates to the field of semiconductor processing, and more particularly to the formation of metal gate electrodes.

BACKGROUND OF THE INVENTION

In the integrated circuit (IC) industry, metal-oxide semiconductor (MOS) transistors have typically been formed utilizing polysilicon gate electrodes. Polysilicon material has been preferred for use as an MOS gate electrode due to its thermal resistive properties (i.e., polysilicon can better withstand subsequent high-temperature processing). Polysilicon's robustness during high-temperature processing allows polysilicon to be annealed at high temperatures along with source and drain regions. Furthermore, polysilicon's ability to block the ion implantation of doped atoms into a channel region is advantageous. Due to the ion implantation blocking potential of polysilicon, polysilicon allows for the easy formation of self-aligned source and drain structures after gate patterning is completed.

However, polysilicon gate electrodes have certain disadvantages. For example, polysilicon gate electrodes are formed from semiconductor materials that suffer from higher receptivities than most metal materials. Therefore, polysilicon gate electrodes may operate at much slower speeds than gates made of metallic materials. To partially compensate for the high resistance, polysilicon materials often require extensive and expensive silicide processing in order to increase their speed of operation to acceptable levels.

Metal gates are therefore being investigated as replacements for polysilicon gates. Metal gates are fabricated in a manner that is similar to the fabrication processes for polysilicon gates. An exemplary layer structure is depicted in FIG. 1A of a metal gate structure. Gate oxide layer 12 is first deposited on a substrate 10. A barrier layer 14, made of titanium nitride (TiN), for example, is formed on the gate oxide layer 12. The layer 14 is primarily chosen for appropriate workfunction properties which determine the threshold voltage of the transistor structure. The barrier layer also aids in the adhesion of the subsequently formed metal gate. The TiN can be deposited by conventional methodologies, such as physical vapor deposition (PVD). Alternate materials such as TaN, $TaSi_xN_y$, WN etc. may be used for this purpose.

A metal gate layer 16 is then formed on the barrier layer 14. An exemplary material for the metal gate layer 16 is tungsten, although other materials may be used. The tungsten is deposited by conventional methodologies, such as physical vapor deposition.

A SiRN anti-reflective coating (ARC) 18 is formed on the metal gate layer 16. This is followed by formation of a cap layer 20 over the ARC layer 18. The cap layer 20 may comprise silicon nitride (SiN), for example. The anti-reflective coating 18 and the cap layer 20 aid in the patterning of the gate prior to the reactive ion etch process used to form the gate. Anti-reflective coatings 18, 20 increase the resolution during the lithography process.

After the deposition of the layers 12–20 over the substrate 10, the metal gate is now etched. This is accomplished by conventional patterning and etching techniques. The tungsten layer is typically etched with a fluorine containing chemistry, such as $SF_6/N_2$ or $SF_6Cl_2/N_2$, with $WF_6$ being the primary product species. The latter chemistry has yielded good profiles. In the latter case, an appropriate $SF_6/Cl_2$ ratio may be chosen to provide the best profiles. The recipe may even be richer in $Cl_2$ than in $SF_6$ as required. It is desirable for the etch to have good selectivity to the TiN of the barrier layer 14 so that the tungsten can be cleared across the entire wafer without attacking the gate oxide. Hence, the TiN ideally serves as an etch stop layer during the etching of the tungsten. An ideal etching process is depicted in FIG. 1B, which shows the patterning of the metal gate electrode by an anisotropic reactive ion etch process, stopping on the TiN at the barrier layer 14. However, this depiction is only an ideal depiction, as the TiN has proven in practice to be an inadequate etch stop layer. As depicted in FIG. 1C, when the tungsten is being cleared from the rest of the wafer, the TiN is completely etched on some parts of the wafer (indicated by reference numeral 22 in FIG. 1C) allowing the etchant to attack the gate oxide 12. This occurs because TiN readily etches in the $Cl_2$ containing W etch chemistry. This results in the gate oxide being exposed either to the F from the W chemistry or being subject to the Cl-based TiN chemistry for the course of the TiN etch, both of which result in damage to the gate oxide. The use of endpoint monitors such as optical emission from W species to stop the W etch from proceeding once the W film clears also does not reliably solve this problem, since the thin TiN film continues to etch quickly while the endpoint is being detected. Thus, even though a TiN etch selective to gate oxide may be employed when W endpoint is detected, the attack of TiN during the W etch process itself makes this approach unreliable in practice. Simply increasing the TiN thickness itself is not practical owing to increases in stress leading to possible delamination and/or an increase in sheet resistance. The complete etching away of the TiN leads to degraded gate oxide and decreased yield.

Replacing the TiN with different etch stop material may detrimentally affect the work function of the TiN, and also may not exhibit the adhesion properties that are desirable in the TiN. However, there is a need for improved structure that allows the etching of tungsten with a $Cl_2/SF_6/N_2$ process that properly stops on the etch stop layer and protects the gate oxide across the wafer, without detrimentally affecting the work function of the metal gate.

SUMMARY OF THE INVENTION

This and other needs are met by the embodiments of the present invention which provide a method of forming a metal gate comprising the steps of forming a gate oxide on a substrate, forming a first metal layer on the gate oxide and forming an etch stop layer on the first metal layer. The etching need not completely stop on this etch stop material—indeed there is usually a finite amount of etching in plasmas due to physical ion bombardment. However, if the etch may be slowed down enough to permit termination of the W etch, an appropriate chemistry may be employed to etch TiN with sufficient selectivity to gate oxide, while being certain that no attack or punchthrough of the TiN layer had taken place in the W etch. The second metal layer is formed on the etch stop layer. The second metal layer is then etched to form a metal gate, with the etching stopping on the etch stop layer. The etch stop layer and the first metal layer are removed except under the second metal layer of the metal gate.

In certain embodiments of the invention, the first metal layer comprises TiN and the etch stop layer on top of the first metal layer comprises either aluminum or tantalum, depending on the nature of the W etch chemistry. If the W etch chemistry is F-rich, aluminum may be used as the etch stop layer owing to the low vapor pressure of $AlF_3$. On the other hand, if the W etch chemistry is Cl-rich, the much lower vapor pressure of $TaCl_5$ as opposed to $TaF_5$ and $WF_6$ will also result in a significant slowdown of the etch rate, allowing the etch to be terminated when clearing of W is detected. Such layers have better etch selectivity than the TiN and can be made thin enough to not affect the work function of the TiN. Hence, the etching of the tungsten may proceed and stop at the etch stop layer, thereby assuredly protecting the gate oxide underlying the etch stop layer and the TiN of the first metal layer. A similar approach may also be used when TaN, TaSiN or WN for example are used as the underlying metal gates, since the F-component of the W etch will readily attack these materials as well as gate oxide. The use of an aluminum etch stop layer will provide a chance to switch to $Cl_2$ based etches with suitable additives such as HBr, $O_2$ or $N_2$, where the etch rate of these materials is much lower and also results in increased selectivity to gate oxide materials.

The earlier stated needs are also met by another embodiment of the present invention which provides a metal gate structure comprising a gate oxide, a first metal layer on the gate oxide, an etch stop layer on the first metal layer, and a second metal layer on the etch stop layer. In certain embodiments of the invention, the first metal layer comprises TiN, and the second metal layer comprises tungsten. In certain embodiments, the etch stop layer comprises tantalum and in other embodiments the etch stop layer comprises aluminum.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the formation of metal gate structures, in particular, to those involved in the etching of a metal gate causing the possible degradation of gate oxide across a wafer. These and other problems are solved, in part, by the present invention which provides an etch stop layer that exhibits greater etch selectivity than the TiN currently used in metal gates. Examples of an etch stop layer include aluminum or tantalum. In etching the tungsten or other metal of a metal gate, the etch stop layer with greater etch selectivity stops the etching better than the TiN of the prior art. This prevents etching through of the TiN and areas of degraded gate oxide across the wafer. The etch stop layer may be made relatively thin, so as to not affect the stack height significantly. The thickness of the etch stop layer also provides adequate etch stopping capability and will not detrimentally affect the work function of the TiN. The etch stop material must itself be etchable in chemistries other than that used for the W etch. For example, Al can be etched in Cl based chemistries, and Ta can be cleared either by a short F based breakthrough or a longer Cl based step.

Figure 1A:
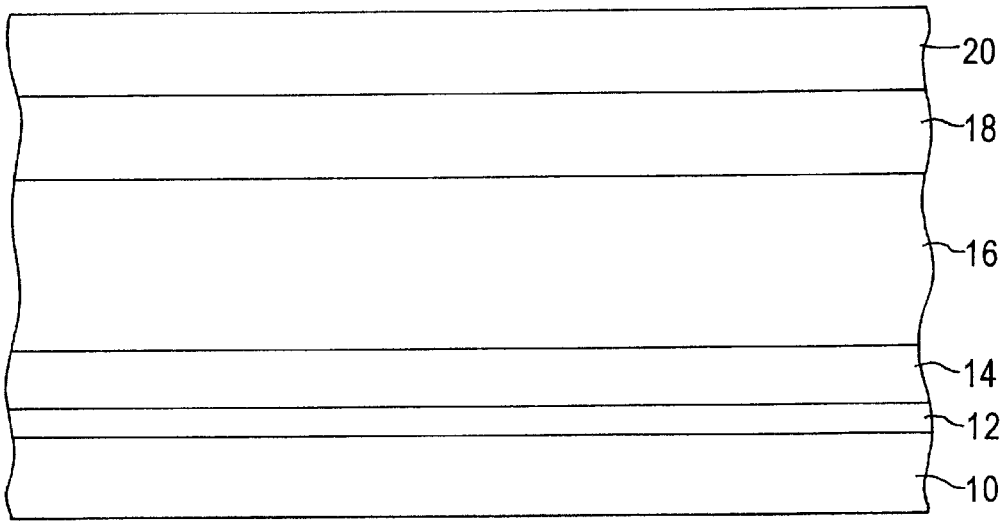
FIG. 1A depicts a metal gate stack prior to the patterning of the metal gate, in accordance with the prior art.
Figure 1B:
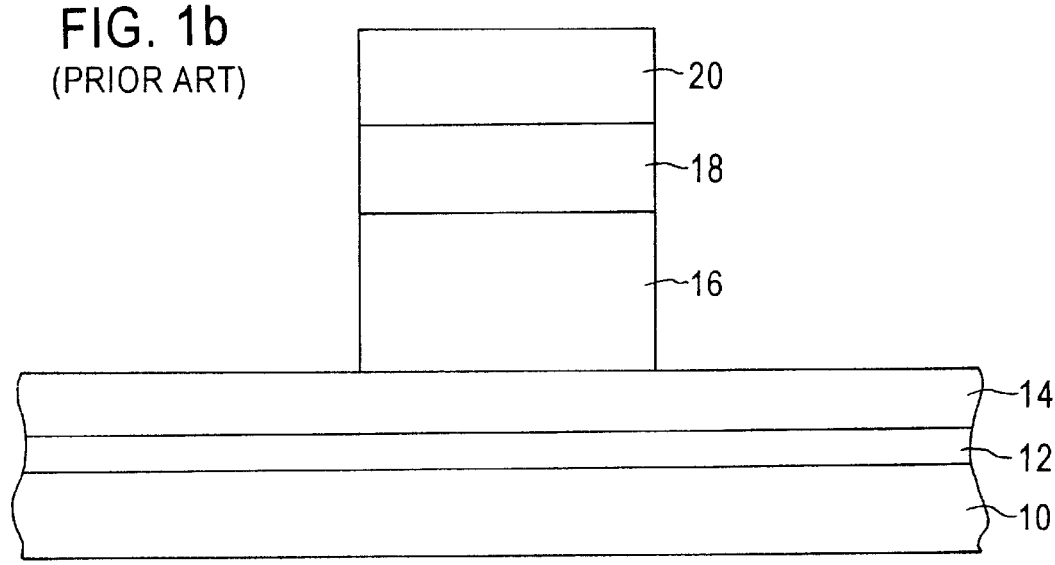
FIG. 1B depicts a metal gate after an ideal etching process in accordance with the prior art.
Figure 1C:
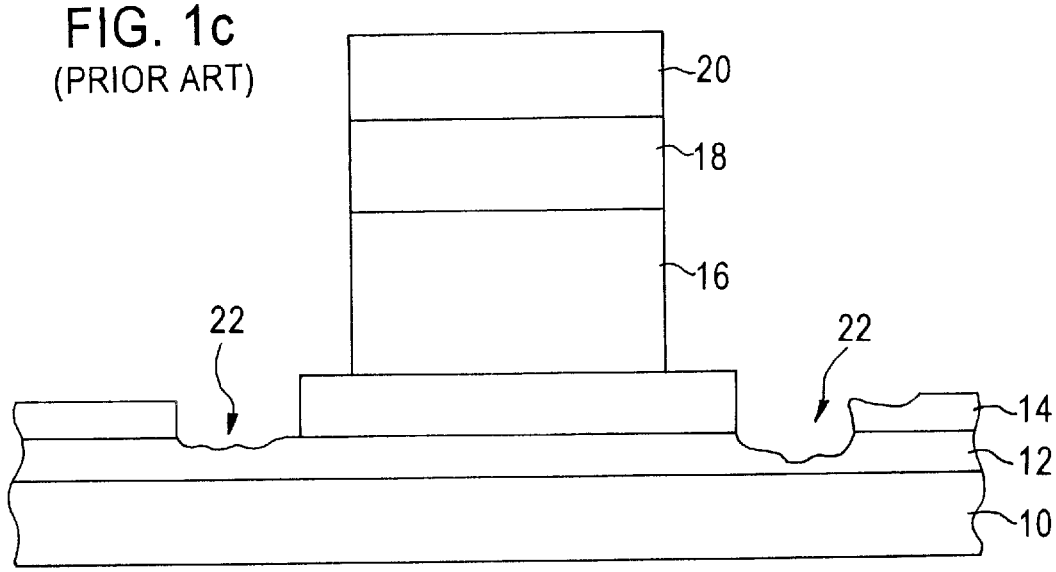
FIG. 1C depicts the metal gate after an actual etching process, exhibiting areas of degraded gate oxide, in accordance with methods of the prior art.
Figure 2:
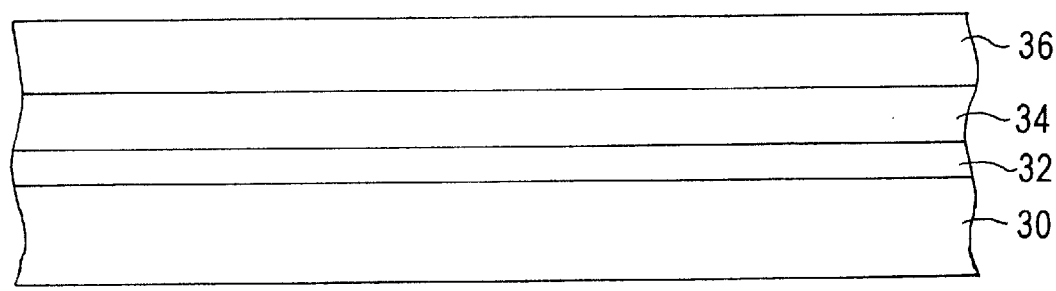
FIG. 2 is a depiction of a cross-section of a portion of a metal gate structure during formation of the metal gate, in accordance with embodiments of the present invention.

FIG. 2 depicts a portion of a metal gate structure during its formation in accordance with embodiments of the present invention. A substrate 30 is provided with a gate oxide layer 32 by conventional methodology. The gate oxide layer 32 has a thickness of between about 15 to about 30 Å in embodiments of the present invention. A first metal layer 34 is formed on the gate oxide layer 32. The first metal layer may comprise TiN, in certain embodiments of the present invention, although other metals may be used. The TiN is deposited by conventional methodologies, such as physical vapor deposition, for example. The thickness of the first metal layer may be between about 100 to about 200 Å in embodiments of the present invention. The first metal layer 34 serves as a barrier layer and an adhesion layer, in certain embodiments. In the prior art, the TiN metal layer served the function of an etch stop layer. It has been found, however, that the TiN is inadequate in this function as it fails to protect the underlying gate oxide across the wafer during the etching of the overlying metal gate layer.

In order to improve the etch stopping capability during the tungsten etch, an etch stop layer 36 is provided on the first metal layer 34. The etch stop layer 36 is required to have a greater etch selectivity than the TiN to the etchant employed with the overlying metal gate. The thickness of the etch stop layer depends, in part, upon the material employed in the etch stop layer 36.

Based upon vapor pressure tables and other considerations, the material of the etch stop layer may be one or more of a number of different materials. Candidates for the etch stop layer include aluminum, tantalum, copper, and gold. Of these materials, aluminum and tantalum are favored, since copper and gold have deleterious effects on transistors. Aluminum forms a stable nonvolatile fluoride $AlF_3$ at typical cathode temperatures (50° C.) and can adequately stop F-containing W etch chemistries. Tantalum chloride has a much lower vapor pressure than $TaF_5$ and $WF_6$ and can appreciably slow down the etch rate in $Cl_2$-rich $SF_6/Cl_2/N_2$ tungsten etch chemistries. Aluminum may be deposited to a lesser thickness, such as between about 50 to 150 Å, while still providing the required etch stop capability.

The relative thinness of the etch stop layer 34 does not substantially affect the height of the metal gate stack, provides an adequate etch stopping capability, and does not significantly impact the work function of the TiN in the underlying first metal layer 34.

Although aluminum and tantalum are described as exemplary etch stop materials in the etch stop layer 36, other materials or combinations of materials may be used without departing from the scope of the present invention.

Figure 3:
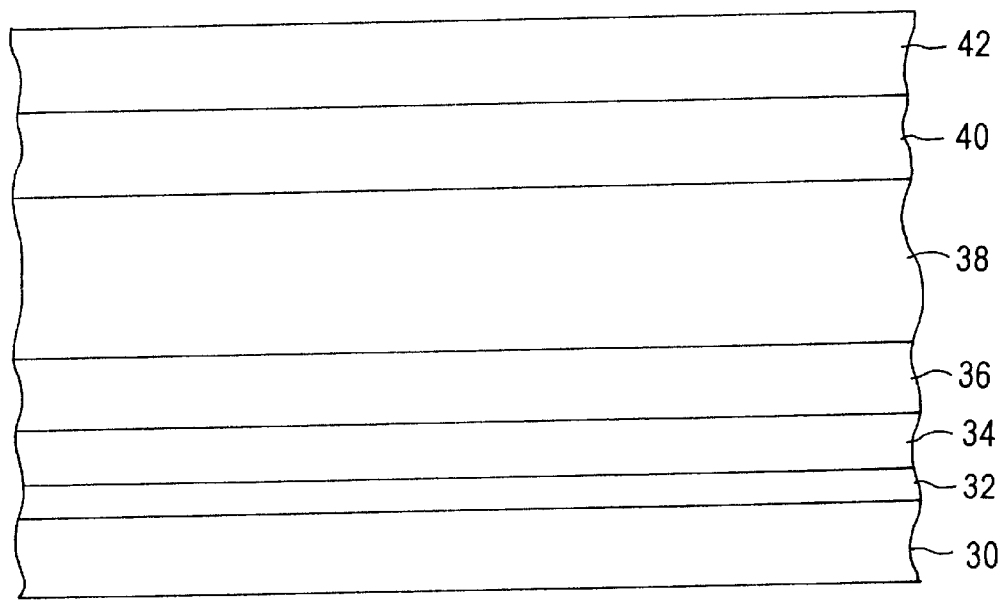
FIG. 3 depicts the structure of FIG. 2 following the deposition of the metal gate and anti-reflective coatings, in accordance with embodiments of the present invention.

Referring to FIG. 3, the remainder of the metal gate structure is provided on the etch stop layer 36. This includes the metal gate, formed by tungsten deposited by PVD, for example. Tungsten may be deposited as a second metal layer 38 to a thickness of between about 500 to about 1,000 Å.

Although tungsten is described as an exemplary material, other metals or metal alloys may be employed in the second metal layer 38.

Anti-reflective coatings, such as an SiRN ARC 40, are provided on the second metal layer 38. A cap layer 42 is then formed over the ARC layer 40. The ARC layer 40 may be between about 300 to about 1,000 Å. The cap layer 42, which may be silicon nitride (SiN), for example, may be between about 300 to about 1,000 Å. The anti-reflective coating of layer 40 and the cap layer 42 aid in the patterning of the metal gate structure.

Figure 4:
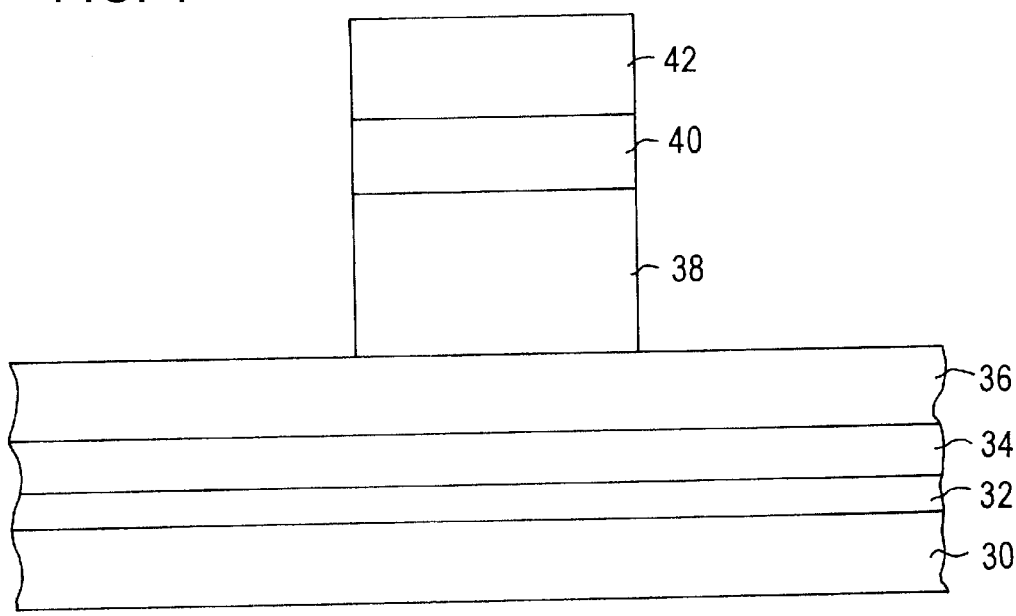
FIG. 4 depicts the metal gate structure after etching has been performed to etch the metal gate and stop on the etch stop layer, in accordance with embodiments of the present invention.

Following the formation and patterning of a resist mask, the metal gate is etched, the results of which are depicted in FIG. 4. A reactive ion etch process, which is an anisotropic etch, is performed. As in conventional methodologies, the etching of the tungsten in the second metal layer 38 is preferably etched with a $Cl_2/SF_6/N_2$ process, which currently provides the best tungsten profiles. Such a process, however, has difficulties stopping on a TiN layer, such as the first metal layer 34. The undesirable complete etching of the TiN and some parts of the wafer leads to degraded gate oxides. The etch stop layer 36 provided by the present invention, however, prevents this unintended etching through to the gate oxide. Hence, the etching process proceeds until the etch stop layer 36 is reached. If aluminum is used as the etch stop layer, the etching effectively stops due to formation of a stable, nonvolatile $AlF_3$ layer at typical cathode temperatures (50° C). Alternately, if tantalum is used as the etch stop layer with a $Cl_2$-rich $Cl_2/SF_6/N_2$ tungsten etch chemistry, the etching slows down appreciably due to the much lower vapor pressure of $TaCl_5$ as compared to $TaF_5$ or $WF_6$. This permits termination of the W etch before any attack of underlying TiN occurs. The complete etching of the TiN and degradation of the gate oxide is thereby prevented.

Figure 5:
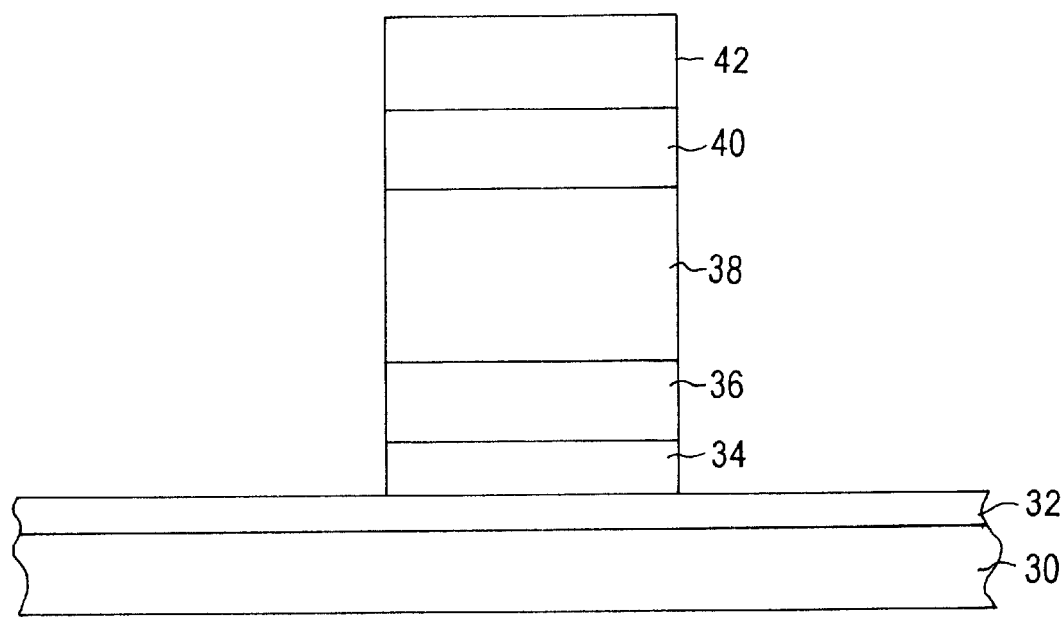
FIG. 5 depicts the metal gate structure of FIG. 4 after the etch stop layer and first metal layer have been removed in accordance with embodiments of the present invention.

A different etch chemistry is now employed, as depicted in FIG. 5, to remove the etch stop layer 36 and the first metal layer 34 over the gate oxide layer 32 in areas not under the second metal layer 38 of the metal gate. In other words, the etch stop layer 36 and the first metal layer 34 are etched across the wafer except within the metal gate structure. The etching, however, can be precisely controlled to prevent degradation of the gate oxide. Suitable etchants for etching the aluminum or tantalum of the etch stop layer 36, and TiN of the first metal layer 34, are well known to those of ordinary skill in the art and may be appropriately selected.

Figure 6:
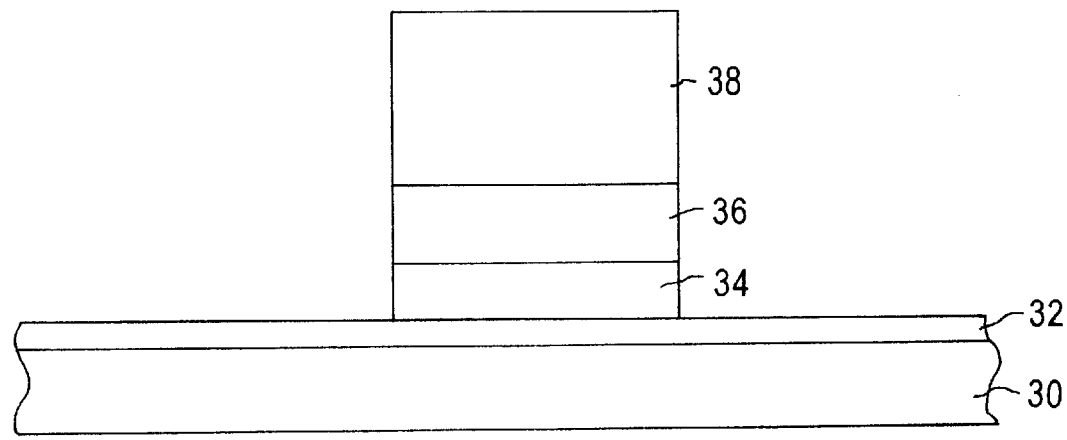
FIG. 6 depicts the metal gate structure of FIG. 5 after the anti-reflective coatings have been removed in accordance with embodiments of the present invention.

FIG. 6 depicts the metal gate structure of FIG. 5 after the cap layer 42 and the anti-reflective coating 40 have been removed by conventional etching techniques. This leaves a metal gate structure that has a gate oxide, a PVD layer of TiN, for example, an etch stop layer and a metal gate layer. The etch stop layer has a thickness that does not significantly affect the stack height and does not deleteriously affect the workfunction of the TiN. The etch stop layer that has been provided protects the gate oxide across the wafer during the etching of the metal gate and serves to improve the yield.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a metal gate on a wafer, comprising the steps of:

forming a gate oxide on a substrate;

forming a first layer on the gate oxide;

forming an etch stop layer on the first metal layer;

forming a metal layer on the etch stop layer;

etching the metal layer to form a metal gate, the etching stopping on the etch stop layer; and removing the etch stop layer and the first layer on the wafer except under the metal layer of the metal gate.

2. The method of claim 1, wherein the first layer comprises TiN.

3. The method of claim 2, wherein the etch stop layer comprises aluminum or tantalum.

4. The method of claim 3, wherein the etch stop layer is formed to a thickness of between about 100 to about 300 Ångstroms.

5. The method of claim 4, wherein the metal layer comprises tungsten.

6. The method of claim 5, further comprising forming an anti-reflective coating on the metal layer prior to etching the metal layer.

7. The method of claim 6, wherein the metal layer is etched with a $Cl_2/SF_6/N_2$ process.

8. The method of claim 2, wherein the etch stop layer comprises aluminum.

9. The method of claim 2, wherein the etch stop layer comprises tantalum.

10. A method of forming a metal gate structure on a wafer, comprising the steps of:

forming a gate oxide on a substrate;

forming a TiN layer on the gate oxide;

forming an etch stop layer comprising at least one of aluminum and tantalum on the TiN layer;

forming a tungsten layer on the etch stop layer;

etching the tungsten layer to form a metal gate, the etching stopping on the etch stop layer; and removing the etch stop layer and the TiN layer on the wafer except under the tungsten layer of the metal gate.

* * * * *

UNITED STATES PATENT AND TRADEMARK OFFICE
CERTIFICATE OF CORRECTION

PATENT NO. : 6,511,911 B1
DATED : January 28, 2003
INVENTOR(S) : Besser et al.

It is certified that error appears in the above-identified patent and that said Letters Patent is hereby corrected as shown below:

<u>Title page,</u>
Item [*] Notice: Subject to any disclaimer, the term of this patent is extended or adjusted under 35 USC 154(b) by (44) days
Delete the phrase "by 44 days" and insert -- by 0 days --

Signed and Sealed this

Twenty-fifth Day of November, 2003

JAMES E. ROGAN
*Director of the United States Patent and Trademark Office*